United States Patent
Kida et al.

(10) Patent No.: US 8,908,349 B2
(45) Date of Patent: Dec. 9, 2014

(54) MEMBER FOR SEMICONDUCTOR MANUFACTURING APPARATUS

(75) Inventors: Masahiro Kida, Yatomi (JP); Toru Hayase, Nagoya (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 405 days.

(21) Appl. No.: 13/420,810

(22) Filed: Mar. 15, 2012

(65) Prior Publication Data

US 2012/0250211 A1 Oct. 4, 2012

(30) Foreign Application Priority Data

Mar. 31, 2011 (JP) ................. 2011-079462

(51) Int. Cl.
*H02N 13/00* (2006.01)
*H01L 21/683* (2006.01)

(52) U.S. Cl.
CPC .................. *H01L 21/6833* (2013.01)
USPC ...................................................... 361/234

(58) Field of Classification Search
USPC ......................... 361/234; 428/615
See application file for complete search history.

(56) References Cited

U.S. PATENT DOCUMENTS

| | | | |
|---|---|---|---|
| 5,707,715 A * | 1/1998 | deRochemont et al. | 428/210 |
| 6,143,432 A * | 11/2000 | de Rochemont et al. | 428/689 |
| 6,797,413 B2 * | 9/2004 | Takeishi et al. | 428/690 |
| 7,608,917 B2 * | 10/2009 | Kajiwara et al. | 257/678 |
| 8,193,634 B2 * | 6/2012 | Wong et al. | 257/717 |
| 2004/0146737 A1 * | 7/2004 | Fujii et al. | 428/632 |
| 2007/0267739 A1 * | 11/2007 | Kajiwara et al. | 257/707 |
| 2012/0250211 A1 * | 10/2012 | Kida et al. | 361/234 |

FOREIGN PATENT DOCUMENTS

| JP | 2002-293655 A1 | 10/2002 |
|---|---|---|
| JP | 2009-060103 A1 | 3/2009 |

* cited by examiner

*Primary Examiner* — Ronald W Leja
(74) *Attorney, Agent, or Firm* — Burr & Brown, PLLC

(57) ABSTRACT

An electrostatic chuck is provided with a ceramic substrate 12 in which an electrode 14 is embedded, an electrode terminal 14a exposed at the bottom of a concave portion 16 disposed on the back surface of the ceramic substrate 12, a power feed member 20 to supply an electric power to the electrode 14, and a joining layer 22 to connect this power feed member 20 to the ceramic substrate 12. The joining layer 22 is formed by using a AuGe based alloy, a AuSn based alloy, or a AuSi based alloy. The ceramic substrate 12 and the power feed member 20 are selected in such a way that the thermal expansion coefficient difference D calculated by subtracting the thermal expansion coefficient of the ceramic substrate 12 from the thermal expansion coefficient of the power feed member 20 satisfies $-2.2 \leq D \leq 6$ (unit: ppm/K).

15 Claims, 7 Drawing Sheets

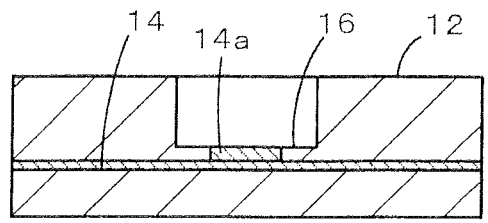
FIG. 3A
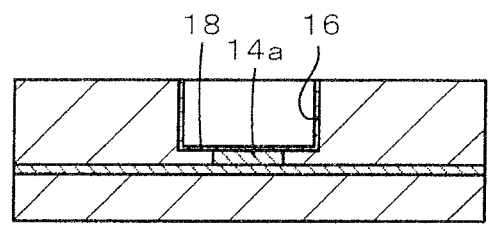
FIG. 3B
FIG. 3C
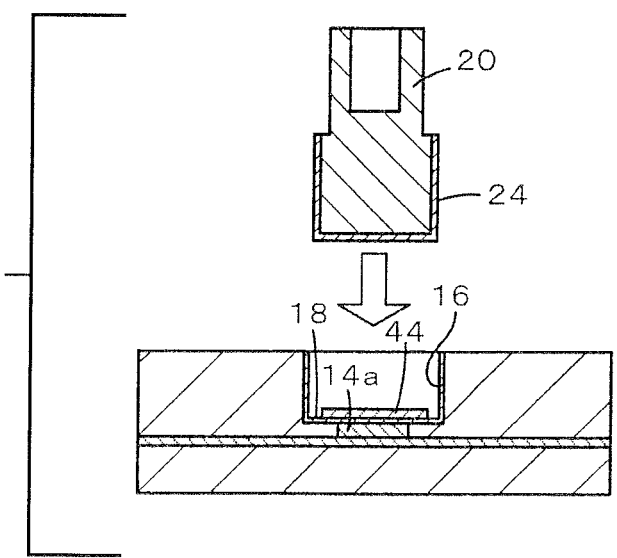

MEMBER FOR SEMICONDUCTOR MANUFACTURING APPARATUS

BACKGROUND OF THE INVENTION

1. Field of the Invention

The present invention relates to a member for a semiconductor manufacturing apparatus.

2. Description of the Related Art

In the field of semiconductor manufacturing apparatuses, alumina ($Al_2O_3$), aluminum nitride (AlN), and the like, which are dense ceramic, are used as a substrate for an electrostatic chuck. Production is performed in such a way that a high-frequency electrode is embedded in a ceramic substrate in order to generate plasma for semiconductor processing. Here, it is necessary that the electrode embedded in the ceramic substrate is electrically joined to a power feed terminal. As for this power feed terminal, a metal material having excellent electrical conductivity is used favorably. In general, the metal material has a large thermal expansion coefficient as compared with that of the ceramic. Therefore, in order to produce a product by being joined to the ceramic substrate, it is required that cracking resulting from a difference in thermal expansion coefficient between ceramic/metal does not occur at the time of joining and, in addition, high joint strength is ensured for the reliability of the product. As for such a joining material, for example, indium is used in PTLs 1 and 2. Consequently, the ceramic substrate can be joined to the power feed terminal with sufficiently high joint strength. Furthermore, indium is soft and, therefore, an occurrence of cracking in the ceramic substrate can be suppressed.

CITATION LIST

Patent Literature

[PTL 1] Japanese Unexamined Patent Application Publication No. 2002-293655
[PTL 2] Japanese Unexamined Patent Application Publication No. 2009-60103

SUMMARY OF THE INVENTION

Meanwhile, in the case where the operation temperature of the electrostatic chuck is from room temperature to about 80° C., there is no problem in the use of indium as the joining material, as described in PTLs 1 and 2. However, in recent years, the needs for higher operation temperatures of the electrostatic chuck have been increased in order to etch a new material. Under such circumstances, there is a problem in that the melting point of indium is low and, therefore, in the case where the operation temperature is 150° C. to 200° C., sufficient joint strength is not obtained. Furthermore, in general, Ag based and Al based alloys are present as brazing filler metals for joining to the ceramic substrate, but all of them have high joining temperatures of 500° C. or higher. Therefore, there is a problem in that a residual stress at the time of joining becomes high. Meanwhile, in order to completely prevent an occurrence of cracking in a ceramic dielectric layer which has become thinner in recent years, a joining technology with a low residual stress is necessary and, in addition, a joining body having high joint strength at 200° C. has been required.

The present invention has been made to solve such problems. Accordingly, the main object of the present invention is to provide a member for a semiconductor manufacturing apparatus, wherein the residual stress at the time of joining is reduced, cracking does not occur in a ceramic substrate, and sufficient joint strength is obtained even when an operation temperature is 200° C.

A member for a semiconductor manufacturing apparatus according to the present invention includes:

a ceramic substrate having a wafer placement surface;
an electrode embedded in the inside of the ceramic substrate;
an exposed electrode portion which is a part of the electrode and which is exposed at the surface opposite to the wafer placement surface of the ceramic substrate;
a power feed member to supply an electric power to the electrode; and
a joining layer which is interposed between the ceramic substrate and the power feed member and which joins the power feed member to the ceramic substrate and, at the same time, electrically connects the power feed member to the exposed electrode portion,
wherein the joining layer is formed by using a AuGe based alloy, a AuSn based alloy, or a AuSi based alloy, which is a joining material,
the ceramic substrate and the power feed member are selected in such a way that the thermal expansion coefficient difference D calculated by subtracting the thermal expansion coefficient of the ceramic substrate from the thermal expansion coefficient of the power feed member satisfies $-2.2 \leq D \leq 6$ (unit: ppm/K), and
the joint strength at 200° C. is 3.5 MPa or more.

According to this member for a semiconductor manufacturing apparatus, the residual stress at the time of joining is reduced, cracking does not occur in a ceramic substrate having a reduced thickness, and sufficient joint strength is obtained even when an operation temperature is 200° C. That is, the member for a semiconductor manufacturing apparatus according to the present invention can be used at room temperature to 200° C. and, therefore, can respond to needs for higher temperatures required of electrostatic chuck and the like in recent years.

Here, it is not preferable that the thermal expansion coefficient difference D is larger than the upper limit value of 6 because interfacial peeling may occur from a joining end portion on the basis of a stress resulting from the thermal expansion coefficient difference and the joint strength may be reduced. Meanwhile, it is not preferable that the thermal expansion coefficient difference D is lower than the lower limit value of −2.2 because cracking may occur in the ceramic substrate on the basis of a stress resulting from the thermal expansion coefficient difference. It is more preferable that the ceramic substrate and the power feed member are selected in such a way that the thermal expansion coefficient difference D satisfies $-2.2 \leq D \leq 0$. In this regard, at the time of filing of the original application, it was believed that the appropriate range was $-1.5 \leq D \leq 6$. Thereafter, studies were performed over and over again and, at present, it has been found that $-2.2 \leq D \leq 6$ is still appropriate.

Regarding the member for a semiconductor manufacturing apparatus according to the present invention, it is preferable that the above-described joining layer contains an intermetallic compound phase generated through reaction between a metal contained in a metallized layer covering a predetermined region including the above-described exposed electrode portion before joining and elements other than Au in the above-described joining material. In addition, it is preferable that a Au-rich phase generated by consumption of the elements other than Au in the above-described joining material through reaction with the metal contained in the above-described metallized layer is contained. This Au-rich phase has advantages that the electrical resistance is low, so as to reduce an electric power loss at the time of feeding of an electric power, the residual stress at the time of joining is relaxed easily because of being soft, and the heat resistance can be enhanced because the melting point is raised as the Au concentration increases through reaction at the time of joining.

Regarding the member for a semiconductor manufacturing apparatus, in the case where the above-described joining layer contains the above-described intermetallic compound phase and the above-described Au-rich phase, it is preferable that the above-described intermetallic compound phase is present between the above-described ceramic substrate and the above-described Au-rich phase. Consequently, reduction in strength is not caused by interfacial peeling easily. Meanwhile, it is preferable that a layer primarily containing the intermetallic compound phase is in contact with the metallized layer or the ceramic substrate. Furthermore, it is preferable that the metallized layer, a layer primarily containing the above-described intermetallic compound phase, and a layer primarily containing the above-described Au-rich phase are stacked in the above-described joining layer in that order from the above-described ceramic substrate side. Consequently, it becomes more difficult that reduction in strength is caused by interfacial peeling. In this case, regarding a portion, in which the power feed member is joined to the ceramic substrate, in the joining layer, it is preferable that the ceramic substrate is in contact with the metalized layer, the metallized layer is in contact with the layer primarily containing the intermetallic compound phase, and the layer primarily containing the intermetallic compound phase is in contact with the layer primarily containing the Au-rich phase.

Regarding the member for a semiconductor manufacturing apparatus according to the present invention, the above-described ceramic substrate may contain one type selected from the group consisting of $Al_2O_3$, AlN, MgO, $Y_2O_3$, and SiC as a primary component, and the above-described power feed member may be selected from the group consisting of Ti, Cu, Ni, Mo, CuW, W, alloys thereof, and FeNiCo based alloys (for example, Kovar (registered trademark)). The ceramic substrate and the power feed member may be selected from the above-described substances in such a way that the thermal expansion coefficient difference D calculated by subtracting the thermal expansion coefficient of the ceramic substrate from the thermal expansion coefficient of the power feed member satisfies $-2.2 \leq D \leq 6$ (unit: ppm/K).

Regarding the member for a semiconductor manufacturing apparatus according to the present invention, when the value of a clearance, which is the value calculated by subtracting the diameter of the power feed member from the diameter of a hole in the ceramic substrate, is represented by C, it is preferable that the C/R ratio of C to the diameter R of the hole of the above-described ceramic substrate satisfies $C/R \leq 0.15$. In this case, when $C/R \leq 0.15$ is satisfied, the joint strength between the ceramic substrate and the power feed member becomes high as compared with that in the case where C/R is out of this range. In addition, the ceramic substrate and the power feed member are preferably selected in such a way that the thermal expansion coefficient difference D satisfies $-2.2 \leq D \leq 0$ (unit: ppm/K), and are more preferably selected in such a way that the $-2.2 \leq D \leq -1.0$ (unit: ppm/K) is satisfied. Consequently, the joint strength is more enhanced because a state in which the power feed member is shrinkage-fitted to the ceramic substrate with the joining layer therebetween can be brought about. Meanwhile, in the case where C/R 0.15 is satisfied, if the value of C/R is large, it is difficult to arrange the power feed member at the center of the hole in the ceramic substrate well. As a result, strength variations occur easily.

Therefore, it is preferable that $C/R \leq 0.09$ is satisfied in order to obtain a joining body having higher strength, less variations, and high reliability.

Regarding the member for a semiconductor manufacturing apparatus according to the present invention, the surface which is opposite to the surface joined to the above-described ceramic substrate, of the above-described power feed member is joined to a coupling member, and the thermal expansion coefficient difference D' calculated by subtracting the thermal expansion coefficient of the above-described ceramic substrate from the thermal expansion coefficient of the coupling member may be more than 6 ppm/K. Such a structure is suitable for the case where the electrical resistance is low and feeding of a large current to an electrode is intended, for example, use of pure Cu or an alloy thereof is intended. In this regard, if the coupling member is joined to the ceramic substrate without through the power feed member, the thermal expansion coefficient difference D' is large, so that peeling occurs at a joining interface. However, such a problem does not occur here because joining is performed through the power feed member.

A method for manufacturing the member for a semiconductor manufacturing apparatus according to the present invention includes (a) a step to prepare the ceramic substrate which has a wafer placement surface and in which an electrode is embedded in the inside, an exposed electrode portion as a part of the electrode is exposed at the surface opposite to the above-described wafer placement surface, and the metallized layer covers a predetermined region including the above-described exposed electrode portion in the surface opposite to the above-described wafer placement surface, (b) a step to select the power feed member to supply an electric power to the above-described electrode in such a way that the thermal expansion coefficient difference D calculated by subtracting the thermal expansion coefficient of the above-described ceramic substrate from the thermal expansion coefficient of the power feed member satisfies $-2.2 \leq D \leq 6$ (unit: ppm/K), and (c) a step to heat and, thereafter, cool while the above-described power feed member is fixed to the region covered with the above-described metallized layer with a AuGe based alloy, a AuSn based alloy, or a AuSi based alloy, which serves as a joining material, therebetween.

According to the method for manufacturing the member for a semiconductor manufacturing apparatus according to the present invention, the above-described member for a semiconductor manufacturing apparatus according to the present invention can be produced easily. In this regard, the temperature in the heating in the step (c) may be set appropriately at a temperature, at which peeling does not occur at the joining interface and cracking does not occur in the ceramic substrate, in accordance with the thermal expansion coefficient difference D. However, 200° C. to 500° C. is desirable, and in particular 250° C. to 420° C. is preferable because the residual stress in the vicinity of the joining interface increases as the heating temperature becomes high.

BRIEF DESCRIPTION OF DRAWINGS

FIGS. 3A-3C are explanatory diagrams showing a joining procedure of a ceramic substrate 12 and the power feed member 20;

DETAILED DESCRIPTION OF THE INVENTION

Figure 1:
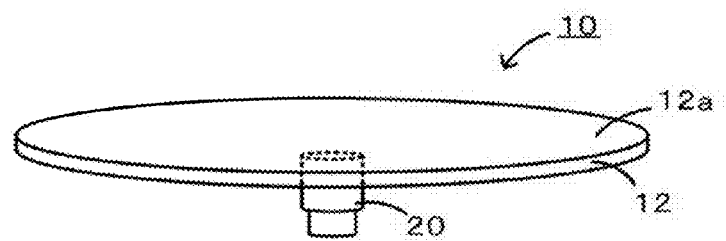
FIG. 1 is a perspective view of an electrostatic chuck 10.
Figure 2:
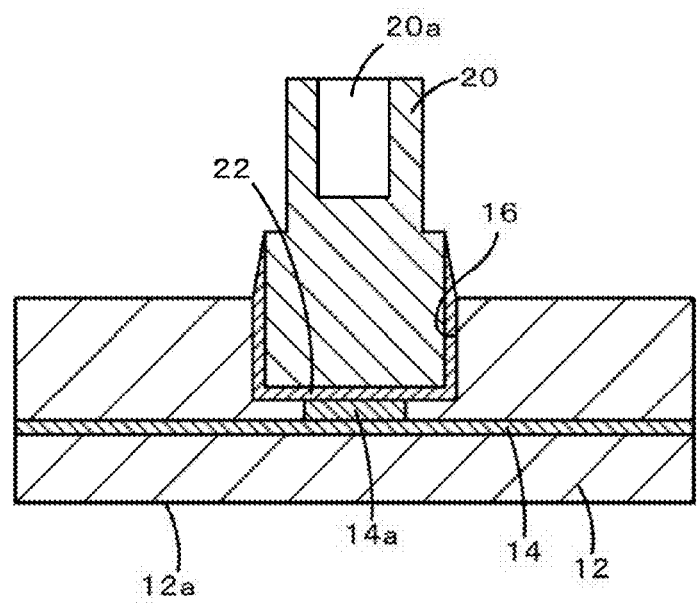
FIG. 2 is a sectional view of the periphery of a connection portion of a power feed member 20.

The present embodiment explains an electrostatic chuck 10 which is an example of a member for a semiconductor manufacturing apparatus. FIG. 1 is a perspective view of the electrostatic chuck 10. FIG. 2 is a longitudinal sectional view of the periphery of a connection portion of a power feed member 20 (the upside and the downside are reverse to those in FIG. 1).

As shown in FIG. 1, the electrostatic chuck 10 is provided with a disc-shaped ceramic substrate 12 having a wafer placement surface 12a and the power feed member 20 joined to this ceramic substrate 12.

As shown in FIG. 2, an electrode 14 is embedded in the inside of the ceramic substrate 12. In this regard, the electrode 14 is used for application to an electrostatic chuck, a heater, high frequency, and the like. A concave portion 16 is disposed at the center of the surface opposite to the wafer placement surface 12a of this ceramic substrate 12. An electrode terminal 14a, which is a part of the electrode 14, is exposed at the bottom of this concave portion 16. In this regard, the electrode terminal 14a is disposed as a member different from the electrode 14 here, but may be the same member as the electrode 14. A portion from the wafer placement surface 12a to the electrode 14 of the ceramic substrate 12 functions as a ceramic dielectric layer or an insulating layer.

The power feed member 20 is a member to feed an electric power to the electrode 14 and is joined to the ceramic substrate 12 with a joining layer 22 therebetween while being inserted in the concave portion 16. The diameter of this power feed member 20 is designed to become slightly smaller than the diameter of the concave portion 16. That is, a clearance is present between the outer circumference surface of the power feed member 20 and the inner circumference surface of the concave portion 16. This clearance is disposed in such a way that the power feed member 20 does not come into contact with the concave portion 16 even when the power feed member 20 is thermally expanded in joining. Meanwhile, the upper portion of the power feed member 20 is connected to an external power supply with a groove 20a or the like. The joining layer 22 is interposed between the power feed member 20 and the concave portion 16 of the ceramic substrate 12, so as to join the power feed member 20 to the ceramic substrate 12 and, at the same time, electrically connect the power feed member 20 to the electrode terminal 14a.

The ceramic substrate 12 is produced from, for example, alumina ($Al_2O_3$), aluminum nitride (AlN), yttria ($Y_2O_3$), or silicon carbide (SiC), which is dense ceramic. Table 1 shows the thermal expansion coefficient of each ceramic at 300° C. The value of the thermal expansion coefficient at 300° C. is shown because the joining temperature in the present invention is about 300° C. Alternatively, as for the ceramic substrate 12, a dense material containing dense magnesia (MgO) as a primary component can also be used. Although not shown in Table 1, the thermal expansion coefficient of high-purity MgO at 300° C. is 12.6 ppm/K.

As for the electrode 14, a material which has electrical conductivity and, in addition, which is not melted in sintering of the ceramic substrate is favorable. For example, W, W carbides, W silicides, Mo, Mo carbides, Mo silicides, Nb, Nb carbides, Nb silicides, Ta, Ta carbides, Ta silicides, Fe, Ni, Ti, platinum, rhodium, and the like and, in addition, mixtures of them and materials for the ceramic, substrate can be used.

Favorably, the electrical resistance of the power feed member 20 is low because it is necessary to feed an electric power to the electrode 14. At this time, as for a guideline of the electrical resistivity, about $1.0 \times 10^{-3}$ Ωcm or less is preferable. As for the material for the power feed member 20, in consideration of suppression of an occurrence of cracking in the ceramic substrate 12 at the time of joining and suppression of peeling at the interface, a material having a thermal expansion coefficient close to that of the ceramic substrate 12 is favorable. However, sometimes limitation to the usable material may occur depending on the use environment or application of the product. Here, the ceramic substrate 12 and the power feed member 20 are specified to be selected in such a way that the thermal expansion coefficient difference D calculated by subtracting the thermal expansion coefficient of the ceramic substrate 12 from the thermal expansion coefficient of the power feed member 20 satisfies $-2.2 \leq D \leq 6$ (unit: ppm/K). If the thermal expansion coefficient difference D is more than the upper limit value, the shrinkage stress on the power feed member 20 side at the time of joining is too large, and unfavorably, the joint strength is reduced because of an occurrence of interfacial peeling from the joining end portion. Meanwhile, if the thermal expansion coefficient difference D is less than the lower limit value, unfavorably, cracking may occur on the concave portion side-surface side of the ceramic substrate 12 because of a stress generated in the radius direction of the power feed member. Examples of the materials for the power feed member 20 include metals selected from the group consisting of Ti, Mo, CuW, W, alloys thereof, and furthermore, FeNiCo based alloys (Kovar (registered trademark)). Meanwhile, in the case where a material, e.g., MgO, exhibiting high thermal expansion is used for the ceramic substrate, Ti, Cu, Ni, an alloy thereof, or the like can be used as the material for the power feed member 20. Table 1 shows the thermal expansion coefficient of each material at 300° C. In this regard, the power feed member 20 is not specifically limited to a metal insofar as the power feed member 20 is formed from an electrically conductive material. Examples of materials may include graphite, carbide ceramic (WC, TaC, and the like), silicide ceramic ($MoSi_2$, $TiSi_2$, and the like), boride ceramic ($TaB_2$, $TiB_2$, and the like), and ceramic/metal composites (SiC/Al, C/Cu, and the like).

TABLE 1

|  | Material | Thermal expansion coefficient (ppm/K) |
| --- | --- | --- |
| Ceramic substrate | AlN | 5.3 |
|  | $Al_2O_3$ | 6.6 |
|  | $Y_2O_3$ | 7.2 |
|  | SiC | 3.7 |
| Power feed terminal | Ti | 10.4 |
|  | Mo | 5.3 |
|  | W | 4.5 |
|  | CuW (11%Cu—89%W) | 6.5 |

TABLE 1-continued

| Material | Thermal expansion coefficient (ppm/K) |
|---|---|
| FeNiCo based (Kovar(registered trademark)) | 5.1 |
| Ni | 14.3 |
| Cu | 18.9 |

(*)300° C. measured data

The joining layer 22 is a layer formed from basically a AuGe based alloy, a AuSn based alloy, or a AuSi based alloy, which is a joining material. In recent years, in order to improve the thermal responsiveness, the thickness of the electrostatic chuck has been reduced, and the thickness of a ceramic dielectric layer to adsorb a wafer has also been reduced. Therefore, there is a problem in that cracking occurs in the dielectric layer easily depending on the residual stress at the time of joining. Consequently, low-temperature joining has been required.

Here, as for the joining material to join the ceramic substrate 12 to the power feed member 20, Al brazing filler, Ag brazing filler, Ni brazing filler, Cu brazing filler, Pb-free solder, In solder, and the like are mentioned in general. Among them, for example, regarding the Ag brazing filler (or AgCuTi active brazing filler metal) commonly used for ceramic joining, the joining temperature is high and is about 800° C., and as for Al brazing filler, about 600° C. The thickness of the ceramic dielectric layer has been reduced and, therefore, there is a problem in that the possibility of occurrence of cracking on the basis of the residual stress at the time of joining increases. Consequently, a technology in which joining can be performed at a further low temperature of about 500° C. has been required from the viewpoint of reduction in residual stress. In addition, there is an advantage that it becomes possible to reduce the cost of the product on the basis of reduction in production cycle time resulting from lowering of the joining temperature. Meanwhile, it is favorable that the electrical resistivity of the joining material is low because the power feed member 20 is electrically connected to the electrode 14, and about $1.0 \times 10^{-3}$ Ωcm or less is desirable. Therefore, as for low-temperature joining, Pb-free solder, In solder, and the like have been used previously, wherein joining is possible at about 200° C. As a trend in the electrostatic chuck, the operating temperature has been room temperature to about 80° C. up to now, whereas in recent years, the needs for higher process temperatures (150° C. to 200° C.) have been increased for etching of a new material, and a joining technology has been required in which the heat resistance at 200° C. is ensured while the joining temperature is lowered to about 500° C. or lower.

The present inventors performed various studies on the joining material. As a result, it was found that among Au based joining materials, a AuSn based alloy (for example, the content of Sn was 15 to 37 percent by weight), a AuGe based alloy (for example, the content of Ge was 10 to 17 percent by weight), and a AuSi based alloy (for example, the content of Si was 3 to 4 percent by weight), which had lowered melting points because of the eutectic compositions, were favorable. Meanwhile, a metal of the metallized layer covering the bottom and the side surface of the concave portion 16 of the ceramic substrate 12 before joining is reacted with solute elements in the Au based joining material and, thereby, an intermetallic compound phase is generated in the joining layer 22. For example, in the case where the metallized layer is Ni and the Au based joining material is the AuGe based alloy, a NiGe phase is generated as the intermetallic compound phase. In the case where the metallized layer is Ni and the Au based joining material is the AuSn based alloy, a $Ni_3Sn_4$ phase is generated as the intermetallic compound phase. In the case where the metallized layer is Ni and the Au based joining material is the AuSi based alloy, a $NiSi_2$ phase is generated as the intermetallic compound phase. In addition, other intermetallic compounds may be generated. In this joining layer 22, a phase containing less solute elements, that is, a Au-rich phase having a high Au concentration, is also generated by consumption of the solute elements through reaction with the metal contained in the metalized layer. The Au-rich phase has advantages that an electric power loss at the time of feeding of an electric power is small because the electrical resistance is low, the residual stress at the time of joining is relaxed easily because of being soft, and the heat resistance can be enhanced because the melting point is raised as the Au concentration increases through reaction.

Next, an example of a method for joining the ceramic substrate 12 to the power feed member 20 will be described with reference to FIGS. 3A-3C. FIGS. 3A-3C are explanatory diagrams showing a joining procedure of a ceramic substrate 12 to the power feed member 20. For convenience of explanation, the ceramic substrate 12 is specified to be formed from dense ceramic.

Initially, as shown in FIG. 3A, a member is prepared, in which the concave portion 16 from the surface of the ceramic substrate 12 produced through sintering toward the electrode 14 is included, and the upper surface of the electrode terminal 14a is exposed at the bottom of the concave portion 16. Subsequently, the bottom of the concave portion 16 is subjected to a roughing treatment by using a sandblast method. Thereafter, a metallized layer 18 is formed all over the surface of the concave portion 16 and the upper surface of the electrode terminal 14a through electroless plating (refer to FIG. 3B). The metallized layer 18 can be formed by, for example, a vapor phase method (CVD, sputtering) or a liquid phase method (electroplating, electroless plating). In particular, the electroless plating can cover the surface of the ceramic substrate 12 easily. Regarding the electroless plating, examples of material species include Ni, Cu, and Au, and electroless Ni plating is employed here. The metallized layer 18 has an effect of facilitating wetting and spreading of the joining material described later, and a thickness to effect wetting and spreading is necessary. The thickness may be about 0.1 μm or more. If the film thickness is too large, unfavorably, the plating treatment time increases so as to increase the cost and, in addition, poor adhesion to the ceramic substrate 12 because of a film stress along with an increase in thickness causes a problem. The thickness is about 20 μm or less in general.

Then, a joining material 44 (AuSn based alloy, AuGe based alloy, or AuSi based alloy) is prepared on the metallized layer 18. Here, a foil-shaped rolled thin sheet is used as the joining material, although a paste-like joining material may be used. Subsequently, a lower portion of the power feed member 20 prepared separately is inserted into the concave portion 16 and is set in a furnace while a weight is placed on the power feed member 20 (refer to FIG. 3C). A metal film 24 is formed on the lower surface and the side surface of the power feed member 20 in order to improve the wettability at the time of joining. The metal film 24 can be formed by a vapor phase method (CVD, sputtering) or a liquid phase method (electroplating, electroless plating). In particular, in the case where the power feed member 20 is formed from a metal, the electroless plating can cover the surface easily. As for the type of plating at this time, Ni plating is favorable in the case where the joining material to form the joining layer 22 is a Au based joining material. Then, heating is performed in an inert gas or in a vacuum while the power feed member 20 is set in the furnace, so as to melt the joining material 44. Thereafter, cooling is performed in such a way that cracking does not occur in the ceramic substrate side and, thereby, the joining material 44 is solidified to join. As a result, the intermetallic compound phase and the Au-rich phase are contained in the joining layer 22, and the intermetallic compound phase is present between the ceramic substrate 12 and the Au-rich phase or the metallized phase covering the bottom and the side surface of the concave portion 16 before joining, a layer primarily containing the intermetallic compound phase, and a layer primarily containing the Au-rich phase are stacked in that order from the ceramic substrate 12 side depending on the heating temperature. In this manner, the electrostatic chuck 10 having the joining structure shown in FIG. 2 is produced.

According to the electrostatic chuck 10 of the present embodiment described above, the residual stress at the time of joining is reduced, cracking does not occur in the ceramic substrate, and sufficient joint strength and electrical conduction characteristics are obtained even when the operating temperature is 200° C. because the above-described joining structure is adopted. That is, the electrostatic chuck 10 can be used at room temperature to 200° C. and, thereby, it is possible to respond to needs for higher temperatures sufficiently.

Furthermore, the joining layer 22 has the Au-rich phase. This Au-rich phase has advantages that an electric power loss at the time of feeding of an electric power is small because the electrical resistance is low, the residual stress at the time of joining is relaxed easily because of being soft, and the heat resistance is high because the melting point is high.

It is to be understood that the present invention is not limited to the embodiments described above, and can be realized in various forms within the technical scope of the present invention.

Figure 4:
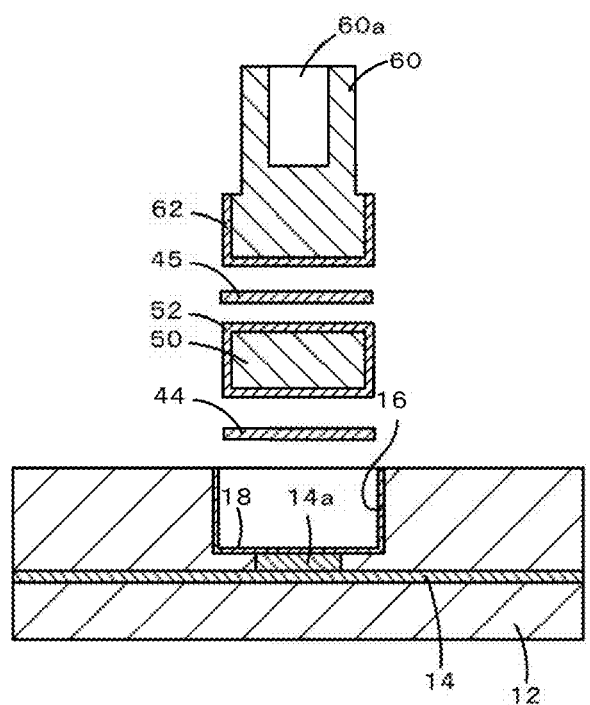
FIG. 4 is a sectional view of the periphery of a connection portion of a power feed member 50.

For example, a power feed member 50 shown in FIG. 4 may be adopted instead of the power feed member 20 in the above-described embodiment. This power feed member 50 is a circular cylinder member having no groove, and a coupling member 60 is joined to the upper surface, that is, a surface opposite to the surface joined to the ceramic substrate 12. A metallized layer 52 is disposed all over the surface of this power feed member 50. The coupling member 60 is favorable in the case where the thermal expansion coefficient difference D' calculated by subtracting the thermal expansion coefficient of the ceramic substrate 12 from the thermal expansion coefficient of the coupling member 60 is more than 6 ppm/K, for example, use of pure Cu or an alloy thereof is intended. The upper portion of this coupling member 60 is connected to an external electrode with a groove 60a or the like. Furthermore, a metallized layer 62 is disposed on the bottom and the side surface of the coupling member 60. The lower surface of the coupling member 60 is joined to the upper surface of the power feed member 50 by using a joining material 45 similar to the above-described joining material 44. Such a structure is favorable in the case where feeding of a large current to the electrode 14 is intended or use of, for example, pure Cu or an alloy thereof is intended. If such a coupling member 60 is used instead of the power feed member 20 shown in FIG. 1, the thermal expansion coefficient difference between the coupling member 60 and the ceramic substrate 12 is too large, so that peeling may occur at a joining interface. However, in FIG. 4, such a problem does not occur because the coupling member 60 is coupled to the ceramic substrate 12 through the power feed member 50. In this regard, the ceramic substrate 12, the power feed member 50, and the coupling member 60 may be joined in one joining step while the joining materials 44 and 45 are sandwiched between the ceramic substrate 12 and the power feed member 50 and between the power feed member 50 and the coupling member 60, respectively. Alternatively, the power feed member 50 and the coupling member 60 may be joined and integrated in advance and, thereafter, the resulting integrated member and the ceramic substrate 12 may be joined with the joining material therebetween. In the latter case, the joining materials 44 and 45 may be the same or be different. In the case where the joining materials 44 and the 45 are different, the joining temperatures in the two joining steps may be different. As for a method for joining and integrating the power feed member 50 and the coupling member 60 in advance, for example, welding, brazing, or the like can be performed in such a way that melting does not occur at a joining temperature of the Au based alloy according to the present invention. In this case, the power feed member and the coupling member are integrated in advance and, thereby, there is an advantage that at the time of joining, the members are handled easily as compared with that in the simultaneous joining step in one operation.

Figure 5:
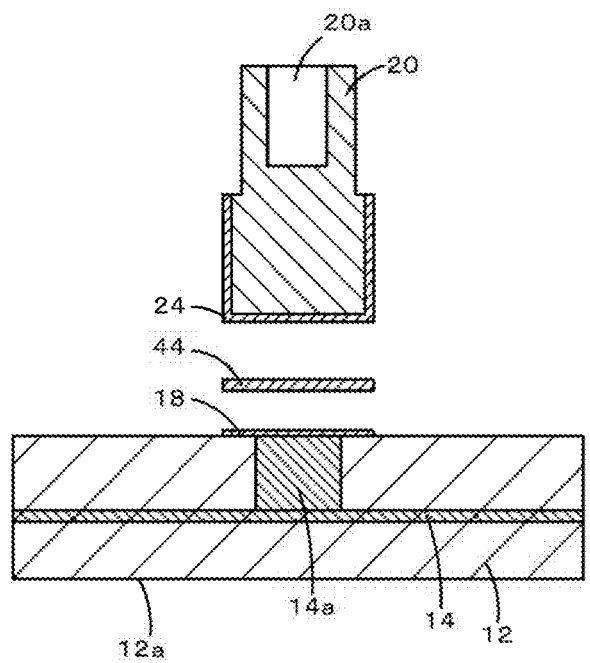
FIG. 5 is a sectional view of the periphery of a connection portion of the power feed member 20 in the case where a concave portion 16 is not disposed.

In the above-described embodiment, the concave portion 16 is disposed in the ceramic substrate 12. However, as shown in FIG. 5, a configuration in which the concave portion 16 is not disposed may be employed. In this case, a metal film 24 is disposed on the bottom and the side surface of the power feed member 20. In this regard, reference numerals in FIG. 5 represent the same constituents as those in the above-described embodiment. Therefore, explanations thereof are omitted here.

In the above-described embodiment, the example in which the structure of the member for a semiconductor manufacturing apparatus according to the present invention is applied to the electrostatic chuck 10 is shown, although not specifically limited to this. For example, application to a ceramic heater and the like may be made.

EXAMPLES

[1] Production of Specimen

[1-1] Production Procedure of Specimen S1

Figure 6:
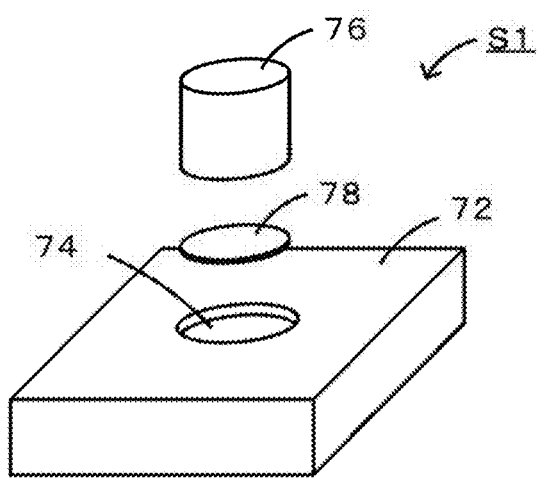
FIG. 6 is an perspective exploded view of Specimen S1.

Specimen S1 simulating the joining structure shown in FIG. 2 was produced as described below. FIG. 6 is a perspective exploded view of Specimen S1. Initially, a concave portion 74 having a diameter of 6.00 mm and a depth of 0.5 mm was formed in a ceramic substrate 72 having a length of 20 mm, a width of 20 mm, and a thickness of 5 mm. Thereafter, the inside of the concave portion was subjected to a roughing treatment through sandblast, and about 3 μm of electroless Ni plating was applied. As for the material for the ceramic substrate 72, alumina ($Al_2O_3$), aluminum nitride (AlN), yttria ($Y_2O_3$), silicon carbide (SiC), and magnesia (MgO) were used. Furthermore, a power feed member 76 having a diameter of 5.95 mm and a height of 6 mm and a joining material 78 having a diameter of 5.8 mm and a foil thickness of 100 μm were prepared. Moreover, the value of the C/R ratio of a clearance C calculated by subtracting the diameter of the power feed member 76 from the diameter R of the concave portion 74 to R was 0.008. As for the material for the power feed member 76, Ti, Mo, CuW, FeNiCo based alloys (Kovar (registered trademark)), Ni and Cu were used. Regarding materials other than Ni, the power feed member 76 provided with a Ni layer on the bottom and the side surface by being subjected to an electroless Ni plating treatment was prepared. Meanwhile, as for the joining material 78, a AuGe based alloy (Au-12 percent by weight Ge, melting point 356° C.), a AuSn based alloy (Au-20 percent by weight Sn, melting point 280° C.), a AuSi based alloy (Au-3.15 percent by weight Si, melting point 363° C.), a ZnAl alloy (Zn-5 percent by weight Al, melting point 382° C.), pure In (melting point 156° C.), and a AgCuTi based active metal (TKC-711, produced by Tanaka Kikinzoku Kogyo K.K., melting point 790° C.) were used. These ceramic substrate 72, power feed member 76, and joining material 78 were subjected to ultrasonic cleaning in acetone. Thereafter, the joining material 78 was put into the concave portion 74 in the ceramic substrate 72, and the power feed member 76 was placed thereon. Subsequently, setting into a furnace was performed while a weight load (200 g) was applied to the upper surface of the power feed member 76, and joining was performed at a joining temperature and in an atmosphere shown in Table 2. In this regard, the keeping time at the joining temperature was specified to be 10 minutes, and joining was performed at temperature raising and lowering rates of 5° C./min.

[1-2] Production Procedure of Specimen S2

Figure 7:
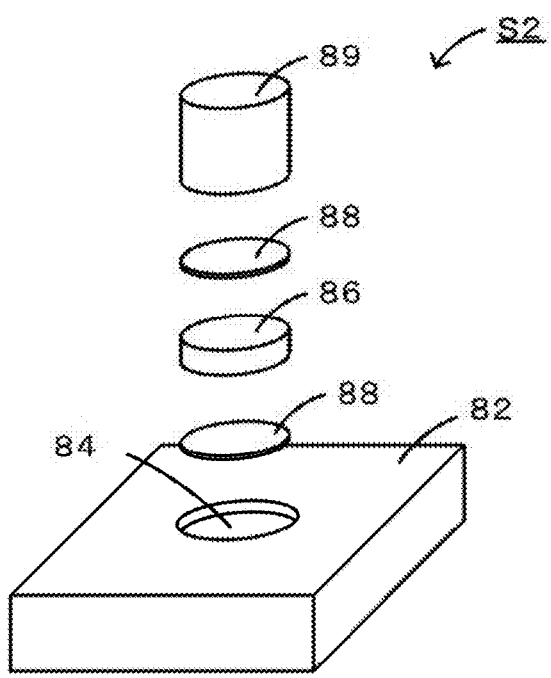
FIG. 7 is an perspective exploded view of Specimen S2.

Specimen S2 simulating the joining structure shown in FIG. 4 was produced as described below. FIG. 7 is a perspective exploded view of Specimen S2. Initially, a concave portion 84 having a diameter of 6.00 mm and a depth of 0.5 mm was formed in a ceramic substrate 82 having a length of 20 mm, a width of 20 mm, and a thickness of 5 mm. Thereafter, the inside of the concave portion was subjected to a roughing treatment through sandblast, and about 3 μm of electroless Ni plating was applied. Furthermore, a power feed member 86 having a diameter of 5.95 mm and a height of 1 mm, a coupling member 89 having a diameter of 5.95 mm and a height of 6 mm, and a joining material 88 (2 sheets) having a diameter of 5.8 mm and a foil thickness of 100 were prepared. Moreover, the value of the C/R ratio of a clearance C calculated by subtracting the diameter of the power feed member 86 from the diameter R of the concave portion 84 to R was 0.008. Preparation was performed in such a way that the all surfaces of the power feed member 86 and the bottom and the side surface of the coupling member 89 were subjected to a Ni electroplating treatment to form Ni layers. These ceramic substrate 82, power feed member 86, coupling member 89, and joining material 88 were subjected to ultrasonic cleaning in acetone. Thereafter, the joining material 88 was put into the concave portion 84 in the ceramic substrate 82, and the power feed member 86, another joining material 88, and the coupling member 89 were placed thereon in that order. Subsequently, setting into a furnace was performed while a weight load (200 g) was applied to the upper surface of the coupling member 89, and joining was performed at a joining temperature and in an atmosphere shown in Table 3. In this regard, the keeping time at the joining temperature was specified to be 10 minutes, and joining was performed at temperature raising and lowering rates of 5° C./min.

[1-3] Production Procedure of Specimens S3 to S6

Specimens S3 to S6 simulating the joining structure shown in FIG. 2 were produced on the basis of the production procedure for Specimen S1. Concretely, Specimens S3 to S6 were produced in the same production procedure as that for Specimen S1 except that the diameters of the power feed member 76 were specified to be 5.90 mm, 5.75 mm, 5.50 mm, and 5.20 mm, respectively. Regarding the resulting Specimens S3 to S6, the value of the C/R ratio of a clearance C to the diameter R of the concave portion 74 of the ceramic substrate 72 were 0.017, 0.042, 0.083, and 0.133, respectively. In this regard, as for the material for the ceramic substrate 72, alumina was used. The power feed member 76 was prepared in such a way that Mo was used as the material, and the bottom and the side surface were subjected to a Ni electroplating treatment to form Ni layers. Meanwhile, as for the joining material 78, a AuGe based alloy and a AuSn based alloy were used. In this regard, Specimens S3 to S6 were the same as Specimen S1 except that the diameter of the power feed member 76 was different and, therefore, they are not shown in the drawing.

[2] Evaluation

[2-1] Evaluation of Joint Strength

A tensile test was performed to evaluate the joint strength. Specimens S1 to S6 used for the tensile test were produced in the above-described production procedure. In this regard, ceramic substrates 72 and 82, in which the electrode was not embedded, were used. Meanwhile, the power feed member 76 and the coupling member 89, which were provided with a female screw of M3 in the upper surface, were used. Regarding the tensile test, each of Specimens S1 to S6 was fixed with a test jig and was connected through the female screws on the upper surfaces of the power feed member 76 and the coupling member 89. The power feed member 76 and the coupling member 89 were drawn at a crosshead speed of 0.5 mm/min, and a load at the time of fracture was measured. Thereafter, the joint strength was calculated on the basis of the areas of the individual member bottoms. This test was performed at 200° C. The test at 200° C. was performed after Specimens S1 to S6 were heated with a heater and, thereby, the whole reached 200° C., followed by soaking. At least three joining bodies were subjected to the tensile test, and an average strength of the joining bodies was calculated. In this regard, in the case where the fracture stress at 200° C. was 3.5 MPa or more, it was determined that the joint strength was sufficient in order that the durability was ensured against a force applied in use environment and handling of the joining section.

[2-2] Evaluation of Cracking

In order to evaluate presence or absence of cracking in the dielectric layer in the ceramic substrate, a fluorescent-penetrant inspection, which was a nondestructive inspection, was performed. Specimens S1 to S6 used for the fluorescent-penetrant inspection were produced in the production procedure according to the above-described item [1]. In this regard, ceramic substrates 72 and 82, in which the electrode was embedded, were used. Concretely, the electrodes were embedded at positions having a height of 0.3 to 0.5 mm from the surfaces (wafer surfaces) opposite to the surfaces provided with the concave portions 74 and 84 of the ceramic substrates 72 and 82. Regarding the fluorescent-penetrant inspection, a commercially available fluorescent-penetrant liquid was penetrated into the surfaces opposite to the surfaces provided with the concave portions 74 and 84 of Specimens S1 to S6. Thereafter, black light (ultraviolet rays) was applied and presence or absence of cracking was evaluated.

[2-3] Evaluation of Interfacial Peeling

In order to evaluate presence or absence of interfacial peeling in the joining portion of the concave portion of the ceramic substrate and the lower surface of the power feed member, a fluorescent-penetrant inspection was performed. This fluorescent-penetrant inspection was performed at the same time with the above-described tensile test at room temperature according to the above-described item [2-1]. That is, in the tensile test according to the above-described item [2-1], the fluorescent-penetrant liquid (as described above) was applied to the joining portion of the ceramic substrates 72 and 82 and the power feed members 76 and 86 of Specimens S1 to S6 from the outer circumference of the power feed members 76 and 86 in advance, and was penetrated into the interfacial portion by a vacuum impregnation treatment, followed by drying. Thereafter, the tensile test of Specimens S1 to S6 at room temperature was performed to measure the load at the time of fracture and, in addition, black light was applied to the concave portions 74 and 84 of ceramic substrates 72 and 82 after fracture to evaluate the peeling state at the joining interface. Here, in the case where peeling had occurred at the joining interface before the tensile test, the fluorescent-penetrant liquid was penetrated to the lower surface of the power feed member and, therefore, the interface shone bright when the back light was applied. In contrast, in the case where peeling had not occurred at the joining interface before the tensile test, the interface did not shine bright and remained in the dark state. Consequently, presence or absence of interfacial peeling was evaluated on the basis of whether the interface shone or not when the black light was applied. In this regard, as for the evaluation criteria, a symbol ○ indicated 100% to 70%, a symbol Δ indicated 70% to 30%, and a symbol x indicated 30% or less on the basis of the area ratio of the joining portion in the power feed member bottom.

[2-5] Microstructure Observation, EDS Analysis

Microstructure observation of the sample was performed by using SEM (scanning electron microscope). Furthermore, at the time of SEM observation, point analysis by EDS was performed for element analysis of each phase after joining.

[3] Examples and Comparative Examples Regarding Specimen S1

[3-1] Examples 1 to 10, Comparative Examples 1 to 4

Here, various studies on the material for the power feed member 76 were performed by using $Al_2O_3$ as the ceramic substrate 72 and using a AuGe based alloy as the joining material 78. Table 2 shows the temperatures and atmospheres in joining at that time. In this regard, the individual evaluation results are also shown in Table 2.

In Examples 1 to 4 and Comparative examples 1 and 2, Ti was used as the material for the power feed member 76. The thermal expansion coefficient difference D (ppm/K) at this time was 3.8. As shown in Examples 1 to 4, in the case where the joining temperature was 330° C. to 390° C., every joint strength at 200° C. was 3.5 MPa or more, and cracking did not occur. Regarding Example 4 (joining temperature 330° C.), in microstructure observation, three layers were observed between the ceramic substrate and the power feed member, similarly to FIG. 8 described later. Regarding Example 2 (joining temperature 360° C.), it was found that a NiGe phase was present between the ceramic substrate and the Au-rich phase, similarly to FIG. 9 described later. On the other hand, as shown in Comparative example 1, in the case where the joining temperature was 310° C., the joining material was not melted well and, thereby, the joint strength was not able to be evaluated. Meanwhile, as shown in Comparative example 2, in the case where the joining temperature was 410° C., the joint strength was 3.5 MPa or less and was insufficient. Regarding this Comparative example 2, according to the result of the microstructure observation and the EDS analysis, similar to FIG. 10 described later, the reaction with the Ni plating layer by the joining material was too strong and, in addition, the thermal expansion coefficient difference D was large, so that interfacial peeling occurred.

Figure 8:
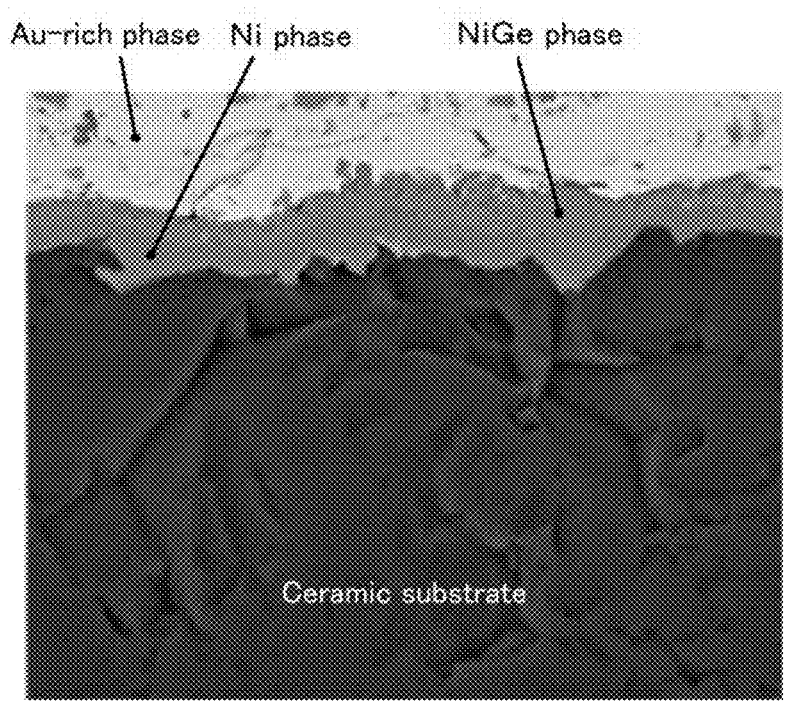
FIG. 8 is a SEM photograph (back-scattered electron image) of Experimental example 6.
Figure 9:
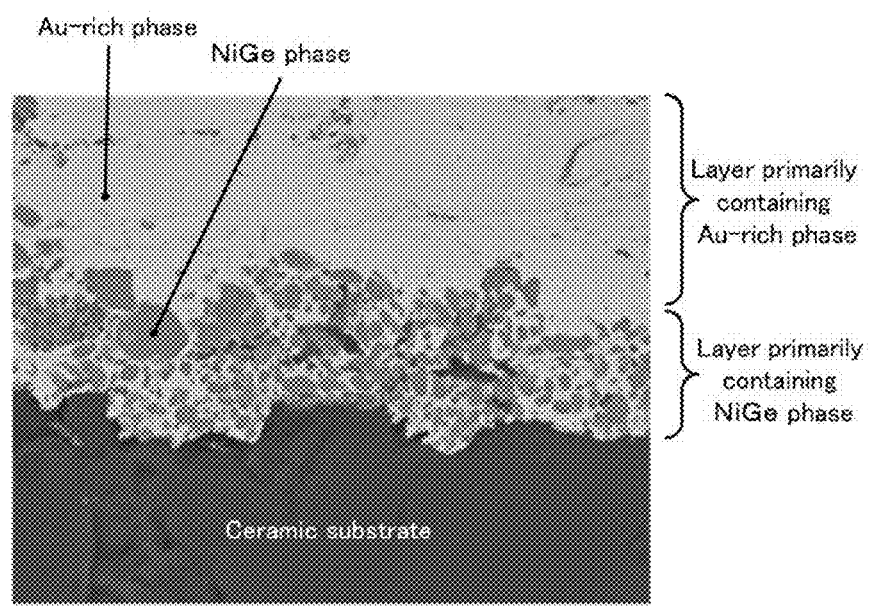
FIG. 9 is a SEM photograph (back-scattered electron image) of Experimental example 5.

From these results, it is believed that in the case where the power feed member 76 was Ti and the ceramic substrate 72 was alumina, that is, in the case where the thermal expansion coefficient difference D (ppm/K) was 3.8 and was within the range of 0 to 6, regarding Examples 2 and 4 having microstructures shown in FIG. 8 and FIG. 9 described later, a metallized layer (layer primarily containing a Ni phase) and a layer primarily containing an intermetallic compound phase (NiGe phase) were present on the ceramic substrate side and, thereby, interfacial peeling was suppressed and a reduction in joint strength at 200° C. was not caused.

Figure 10:
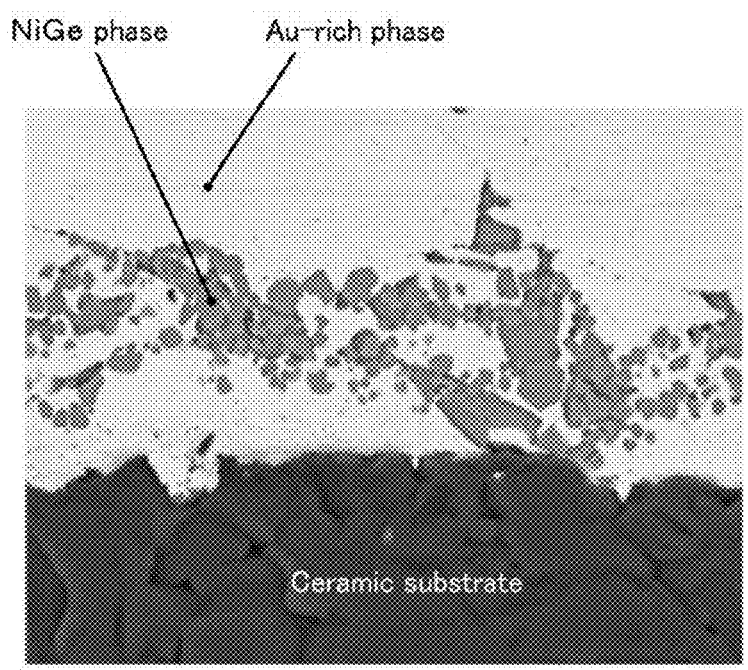
FIG. 10 is a SEM photograph (back-scattered electron image) of Experimental example 7.

In Examples 5 to 7, Mo was used as the material for the power feed member 76. In the case where the joining temperature was within the range of 340° C. to 410° C., every joint strength at 200° C. was high, and cracking did not occur. Regarding Example 6 (joining temperature 330° C.), in microstructure observation, three layers were observed between the ceramic substrate and the power feed member, as shown in FIG. 8. As is clear from the results of the EDS analysis, these phases were a layer primarily containing a Ni phase, a layer primarily containing a NiGe phase, and a layer primarily containing a Au-rich phase (Au concentration 95 percent by weight) in that order from the ceramic substrate side. Regarding Example 5 (joining temperature 360° C.), in the microstructure observation, it was found that a NiGe phase was present between the ceramic substrate and the Au-rich phase, as shown in FIG. 9. Concretely, in the structure, a layer primarily containing a NiGe phase and a layer primarily containing a Au-rich phase were stacked in that order from the ceramic substrate side. Regarding Example 7 (joining temperature 410° C.), in the microstructure observation, it was found that a NiGe phase was present between the ceramic substrate and the Au-rich phase, as shown in FIG. 10. Concretely, in the structure, a layer primarily containing a Ni phase and a layer primarily containing a NiGe phase were not present on the ceramic substrate side, and a NiGe phase was dispersed in a layer primarily containing a Au-rich phase.

From these results, in the case where the power feed member 76 was Mo and the ceramic substrate 72 was alumina, the thermal expansion coefficient difference D (ppm/K) was −1.3 and was within the range of −2.2 to 0. Therefore, it is believed that even in the case where the joining temperature was 410° C., that is, in the case of a microstructure shown in FIG. 10, interfacial products did not exert much effects, interfacial peeling was suppressed and, as a result, reliable strength in high temperatures was obtained stably. Meanwhile, it is also believed that in the range of D of −2.2 to 0, interfacial peeling was suppressed and, in addition, a compressive stress acted to the ceramic substrate side in the radius direction of the power feed member 76 through the joining layer was applied appropriately within the bound of not breaking the ceramic substrate, so as to enhance the joint strength because the power feed member was brought into the state of being shrinkage-fitted to the side surface of the concave portion of the ceramic substrate with the joining material therebetween.

In Example 8, CuW was used as the material for the power feed member 76. In Example 9, a FeNiCo based alloy (Kovar (registered trademark)) was used as the material for the power feed member 76. In Example 10, W was used as the material for the power feed member 76. Every joint strength at 200° C. was high, and cracking did not occur. It is believed that they also had the microstructure as shown in FIG. 9, the thermal expansion coefficients were close to the thermal expansion coefficient of alumina ceramic similarly to Mo, the thermal expansion coefficient differences D were within the range of −2.2 to 0 and, therefore, the state of being shrinkage-fitted was brought about, so as to suppress interfacial peeling. Furthermore, regarding Examples 5, 8, 9, and 10, the joining material and the joining temperature were the same, but the D values were different. When they were compared, regarding Examples 5, 9, and 10 showing D within the range of −2.2 to −1.0, the shrinkage-fitting effect was higher and the joint strength was higher as compared with those in Example 8 showing D out of the above-described range.

In Comparative examples 3 and 4, Ni and Cu were used as the materials for the power feed member 76. Even when the joining temperature was 360° C., the joint strength at 200° C. was 3.5 MPa or less and was low. In particular, in the case where Cu was used for the power feed member, the evaluation results of interfacial peeling by the fluorescent-penetrant inspection were x, and regarding the results of the microstructure observation, gaps along with interfacial peeling were observed between the ceramic substrate and the joining material. It is believed in the case where Ni and Cu were used as the materials for the power feed member 76, the thermal expansion coefficient differences D (ppm/K) were 7.7 and 12.3, respectively, and were more than 6 and, thereby, the shrinkage stress of the power feed member 76 in the radius direction was large at the time of joining, so as to cause interfacial peeling.

[3-2] Examples 11 to 21, Comparative Examples 5 to 8

Here, various studies on the material for the power feed member 76 were performed by using $Al_2O_3$ as the ceramic substrate 72 and using a AuSn based alloy as the joining material 78. Table 2 shows the temperatures and atmospheres in joining at that time. In this regard, the individual evaluation results are also shown in Table 2.

In Examples 11 to 13 and Comparative examples 5 and 6, Ti was used as the material for the power feed member 76. As shown in Examples 11 to 13, in the case where the joining temperature was 290° C. to 330° C., every joint strength at 200° C. was 3.5 MPa or more, and cracking did not occur. On the other hand, as shown in Comparative example 5, in the case where the joining temperature was 280° C., the joining material was not melted well and, thereby, the joint strength was not able to be evaluated. Meanwhile, as shown in Comparative example 6, in the case where the joining temperature was 370° C., the joint strength was less than 3.5 MPa and was insufficient. Regarding Comparative example 6, it is believed that according to the result of the microstructure observation and the EDS analysis, the reaction with the Ni plating layer by the joining material was too strong and there was a thermal expansion difference between the power feed member 76 and the ceramic substrate 72 and, thereby, interfacial peeling occurred easily so as to cause a reduction in strength, as in Comparative example 2.

In Examples 14 to 17, Mo was used as the material for the power feed member 76. In the case where the joining temperature was within the range of 310° C. to 370° C., every joint strength at 200° C. was high, and cracking did not occur. In Examples 18 and 19, CuW was used as the material for the power feed member 76. In Example 20, a FeNiCo based alloy (Kovar (registered trademark)) was used as the material for the power feed member 76. In Example 21, W was used as the material for the power feed member 76. Every joint strength at 200° C. was high, and cracking did not occur. It is believed that the thermal expansion coefficients of all of Mo, CuW, Kovar, and W were close to the thermal expansion coefficient of alumina ceramic, so as to suppress interfacial peeling.

In Comparative examples 7 and 8, Ni and Cu were used as the materials for the power feed member 76. Even when the joining temperature was 310° C., the joint strength at 200° C. was 3.5 MPa or less and was low. In particular, in the case where Cu was used for the power feed member, the thermal expansion coefficient difference was large as in Comparative example 4, and it is believed that the shrinkage stress of the power feed member Cu in the radius direction was large at the time of joining, so as to cause interfacial peeling.

[3-3] Examples 22 to 29

As for the ceramic substrate 72, AlN was used in Examples 22 to 25, $Y_2O_3$ was used in Examples 26 and 27, and SiC was used in Examples 28 and 29. Meanwhile, a AuGe based alloy and a AuSn based alloy were used as the joining material 78. Furthermore, any one of Mo, CuW, and W was used as the power feed member 76. Then, joining was performed at a joining temperature and in an atmosphere shown in Table 2. As a result, it was found that good results were obtained even in the case where the ceramic substrate was changed, as shown in Table 2.

[3-4] Examples 30 to 32

As for the ceramic substrate 72, $Al_2O_3$, AlN, and $Y_2O_3$ were used. Meanwhile, a AuSi based alloy was used as the joining material 78. Furthermore, any one of Mo and CuW was used as the power feed member 76. Then, joining was performed at a joining temperature and in an atmosphere shown in Table 2. As a result, it was found that regarding the AuSi based alloy, good results were obtained in the same manner as those of the other joining materials, as shown in Table 2.

[3-5] Comparative Examples 9 to 12

In all cases, $Al_2O_3$ was used as the ceramic substrate 72. In Comparative example 9, a ZnAl based alloy having a melting point of 500° C. or lower was used as the joining material 78, but the joint strength at 200° C. was less than 3.5 MPa. It is believed that ZnAl exhibited poor wetting and spreading properties and, thereby, the joint strength was low. In Comparative examples 10 and 11, In was used as the joining material 78, but the strength at 200° C. was not exerted because the melting point of In was about 180° C. In Comparative example 12, an active brazing filler metal (Ag—Cu—Ti material) was used as the joining material 78 which was used for ceramic joining in general. However, the joining temperature was high, so that the residual stress increased and cracking occurred. In this regard, in Comparative example 12, a metallized layer was not disposed on the concave portion 74 because the active metal was used and, therefore, was able to be joined to alumina directly. Consequently, it is believed that low-temperature joining at about 500° C. or lower was effective to suppress cracking through reduction in residual stress and, in addition, use of joining body by using the Au based alloy according to the present invention was effective to obtain 200° C. strength.

[3-6] Examples 33 to 37, Comparative Example 13

In Examples 33 to 35, $Al_2O_3$ was used as the ceramic substrate 72, and Mo, CuW, and Kovar were used as the materials for the power feed member 76. In examples 36 and 37, MgO was used as the ceramic substrate 72, and Ni was used as the power feed member 76. Furthermore, as for the joining material 78, AuSn was used in Examples 33 to 35 and 37, and AuGe was used in Example 36. Then, joining was performed at a joining temperature and in an atmosphere shown in Table 2. As a result, it was found that good results were obtained in every case. The reason is believed to be that AuGe and AuSn exhibited good wetting and spreading properties and the thermal expansion coefficient differences D were small. Meanwhile, in Comparative example 13, MgO was used as the ceramic substrate 72, W was used as the power feed member 76, and AuGe was used as the joining material 78. In this case, the D value became too small and, thereby, cracking occurred into the ceramic substrate 72, as described above, so that joining was unsatisfactory.

[3-7] Sample Simulating Actual Member

In consideration of the above-described results of Specimen S1, a joining body was produced by using a structure simulating FIG. 2, that is, a sample simulating an actual member, in which an electrode was embedded in the ceramic substrate, and an evaluation was performed. Joining was performed under the same conditions as in Example 5, Example 17, and Example 30 except that Mo serving as electrodes 14 and 14a was embedded in the ceramic substrate. As a result, the 200° C. strength equivalent to that in the case where the electrode was not embedded was obtained, and cracking did not occur. Moreover, the above-described joining body sample was subjected to electrical conduction test. As a result, it was found that sufficient electrical conductivity was obtained.

[4] Examples Regarding Specimen S2

In Examples 38 to 45, an evaluation test was performed by using Specimen S2. As for the material for the ceramic substrate 82, $Al_2O_3$ was used in Examples 38 to 42 and 45, AlN was used in Example 43, and $Y_2O_3$ was used in Example 44. Meanwhile, any one of Mo, CuW, and a FeNiCo based alloy (Kovar) was used as the power feed member 86, and Cu was used as all coupling members 89. A AuGe based alloy, a AuSn based alloy, or a AuSi based alloy was used as the joining material 88. Then, joining was performed at a joining temperature and in an atmosphere shown in Table 3. As a result, a good result was obtained in every case, as shown in Table 3. According to this, it was found that the thermal expansion coefficient difference was relaxed by employing the above-described structure and, in addition, integration was possible through simultaneous joining in one operation, whereas in the case where Cu of the power feed member was joined to the ceramic substrate directly, the 200° C. strength was low because of interfacial peeling, as in Comparative examples 4 and 8.

TABLE 2

| Classification | Ceramic substrate | Power feed member | D (ppm/K) | Joining material | Joining temperature (° C.) | Atmosphere | 200° C. strength (MPa) | Cracking evaluation | Interfacial peeling | Remarks |
|---|---|---|---|---|---|---|---|---|---|---|
| Example 1 | $Al_2O_3$ | Ti | 3.8 | AuGe | 390 | $N_2$ | 4.2 | ○ | Δ | |
| Example 2 | $Al_2O_3$ | Ti | 3.8 | AuGe | 360 | $N_2$ | 7.8 | ○ | Δ | |
| Example 3 | $Al_2O_3$ | Ti | 3.8 | AuGe | 340 | $N_2$ | 8.1 | ○ | Δ | |
| Example 4 | $Al_2O_3$ | Ti | 3.8 | AuGe | 330 | $N_2$ | 8.8 | ○ | Δ | |
| Comparative example 1 | $Al_2O_3$ | Ti | 3.8 | AuGe | 310 | $N_2$ | — | — | — | Not jointed |
| Comparative example 2 | $Al_2O_3$ | Ti | 3.8 | AuGe | 410 | $N_2$ | 2.5 | — | X | |
| Example 5 | $Al_2O_3$ | Mo | −1.3 | AuGe | 360 | $N_2$ | 14.8 | ○ | ○ | |
| Example 6 | $Al_2O_3$ | Mo | −1.3 | AuGe | 330 | $N_2$ | 15.9 | ○ | ○ | |
| Example 7 | $Al_2O_3$ | Mo | −1.3 | AuGe | 410 | $N_2$ | 9.2 | ○ | ○ | |
| Example 8 | $Al_2O_3$ | CuW | −0.1 | AuGe | 360 | $N_2$ | 11.3 | ○ | ○ | |
| Example 9 | $Al_2O_3$ | Kovar | −1.5 | AuGe | 360 | $N_2$ | 14.5 | ○ | ○ | |
| Example 10 | $Al_2O_3$ | W | −2.1 | AuGe | 360 | $N_2$ | 14.7 | ○ | ○ | |
| Comparative example 3 | $Al_2O_3$ | Ni | 7.7 | AuGe | 360 | $N_2$ | 1.8 | — | X | |
| Comparative example 4 | $Al_2O_3$ | Cu | 12.3 | AuGe | 360 | $N_2$ | <0.4 | — | X | |
| Example 11 | $Al_2O_3$ | Ti | 3.8 | AuSn | 330 | Vac. | 6.4 | ○ | Δ | |
| Example 12 | $Al_2O_3$ | Ti | 3.8 | AuSn | 310 | Vac. | 7.4 | ○ | Δ | |
| Example 13 | $Al_2O_3$ | Ti | 3.8 | AuSn | 290 | Vac. | 8.1 | ○ | Δ | |
| Comparative example 5 | $Al_2O_3$ | Ti | 3.8 | AuSn | 280 | Vac. | — | — | — | Not jointed |
| Comparative example 6 | $Al_2O_3$ | Ti | 3.8 | AuSn | 370 | Vac. | 2.1 | — | X | |
| Example 14 | $Al_2O_3$ | Mo | −1.3 | AuSn | 330 | Vac. | 12.7 | ○ | ○ | |
| Example 15 | $Al_2O_3$ | Mo | −1.3 | AuSn | 370 | Vac. | 7.8 | ○ | ○ | |
| Example 16 | $Al_2O_3$ | Mo | −1.3 | AuSn | 310 | Vac. | 13.4 | ○ | ○ | |
| Example 17 | $Al_2O_3$ | Mo | −1.3 | AuSn | 310 | $N_2$ | 14.1 | ○ | ○ | |
| Example 18 | $Al_2O_3$ | CuW | −0.1 | AuSn | 310 | Vac. | 9.5 | ○ | ○ | |
| Example 19 | $Al_2O_3$ | CuW | −0.1 | AuSn | 310 | $N_2$ | 8.5 | ○ | ○ | |
| Example 20 | $Al_2O_3$ | Kovar | −1.5 | AuSn | 310 | Vac. | 13.8 | ○ | ○ | |
| Example 21 | $Al_2O_3$ | W | −2.1 | AuSn | 310 | Vac. | 13.6 | ○ | ○ | |
| Comparative example 7 | $Al_2O_3$ | Ni | 7.7 | AuSn | 310 | Vac. | 1.4 | — | X | |
| Comparative example 8 | $Al_2O_3$ | Cu | 12.3 | AuSn | 310 | Vac. | <0.4 | — | X | |
| Example 22 | AlN | Mo | 0 | AuGe | 360 | $N_2$ | 9.9 | ○ | ○ | |
| Example 23 | AlN | CuW | 1.2 | AuGe | 360 | $N_2$ | 7.4 | ○ | ○ | |
| Example 24 | AlN | Mo | 0 | AuSn | 310 | Vac. | 8.5 | ○ | ○ | |
| Example 25 | AlN | CuW | 1.2 | AuSn | 310 | Vac. | 6.7 | ○ | ○ | |
| Example 26 | $Y_2O_3$ | CuW | −0.7 | AuGe | 360 | $N_2$ | 11.3 | ○ | ○ | |
| Example 27 | $Y_2O_3$ | CuW | −0.7 | AuSn | 310 | Vac. | 8.5 | ○ | ○ | |
| Example 28 | SiC | W | 0.8 | AuGe | 360 | $N_2$ | 9.2 | ○ | ○ | |
| Example 29 | SiC | W | 0.8 | AuSn | 310 | Vac. | 7.4 | ○ | ○ | |
| Example 30 | $Al_2O_3$ | Mo | −1.3 | AuSi | 390 | Vac. | 12.4 | ○ | ○ | |

TABLE 2-continued

| Classification | Ceramic substrate | Power feed member | D (ppm/K) | Joining material | Joining temperature (° C.) | Atmosphere | 200° C. strength (MPa) | Cracking evaluation | Interfacial peeling | Remarks |
|---|---|---|---|---|---|---|---|---|---|---|
| Example 31 | AlN | Mo | 0 | AuSi | 390 | Vac. | 8.1 | ◯ | ◯ | |
| Example 32 | $Y_2O_3$ | CuW | −0.7 | AuSi | 390 | Vac. | 10.2 | ◯ | ◯ | |
| Comparative example 9 | $Al_2O_3$ | Ti | 3.8 | ZnAl | 430 | $N_2$ | 1.4 | — | X | |
| Comparative example 10 | $Al_2O_3$ | Cu | 12.3 | In | 180 | Air | 0 | ◯ | ◯ | |
| Comparative example 11 | $Al_2O_3$ | Mo | −1.3 | In | 180 | Air | 0 | ◯ | ◯ | |
| Comparative example 12 | $Al_2O_3$ | Ti | 3.8 | AgCuTi | 850 | Vac. | — | X | — | |
| Example 33 | $Al_2O_3$ | Mo | −1.3 | AuSn | 280 | $N_2$ | 14.5 | ◯ | ◯ | |
| Example 34 | $Al_2O_3$ | CuW | −0.1 | AuSn | 280 | $N_2$ | 10.1 | ◯ | ◯ | |
| Example 35 | $Al_2O_3$ | Kovar | −1.5 | AuSn | 280 | $N_2$ | 14.3 | ◯ | ◯ | |
| Example 36 | MgO | Ni | 1.8 | AuGe | 360 | $N_2$ | 7.1 | ◯ | ◯ | |
| Example 37 | MgO | Ni | 1.8 | AuSn | 310 | Vac. | 6.4 | ◯ | ◯ | |
| Comparative example 13 | MgO | W | −8.1 | AuGe | 360 | $N_2$ | — | X | — | |

TABLE 3

| | Ceramic substrate | Power feed member | D (ppm/K) | Coupling member | D' (ppm/K) | Joining material | Joining temperature (° C.) | Atmosphere | 200° C. strength (MPa) | Cracking evaluation | Interfacial peeling |
|---|---|---|---|---|---|---|---|---|---|---|---|
| Example 38 | $Al_2O_3$ | Mo | −1.3 | Cu | 12.3 | AuGe | 360 | $N_2$ | 13.4 | ◯ | ◯ |
| Example 39 | $Al_2O_3$ | CuW | −0.1 | Cu | 12.3 | AuGe | 360 | $N_2$ | 10.2 | ◯ | ◯ |
| Example 40 | $Al_2O_3$ | Kovar | −1.5 | Cu | 12.3 | AuGe | 360 | $N_2$ | 12.4 | ◯ | ◯ |
| Example 41 | $Al_2O_3$ | Mo | −1.3 | Cu | 12.3 | AuSn | 310 | Vac. | 12.7 | ◯ | ◯ |
| Example 42 | $Al_2O_3$ | CuW | −0.1 | Cu | 12.3 | AuSn | 310 | Vac. | 8.5 | ◯ | ◯ |
| Example 43 | AlN | Mo | 0 | Cu | 13.6 | AuGe | 360 | $N_2$ | 9.5 | ◯ | ◯ |
| Example 44 | $Y_2O_3$ | CuW | −0.7 | Cu | 11.7 | AuSn | 310 | Vac. | 7.8 | ◯ | ◯ |
| Example 45 | $Al_2O_3$ | Mo | −1.3 | Cu | 12.3 | AuSi | 390 | Vac. | 11.6 | ◯ | ◯ |

Meanwhile, regarding, Specimen S2, the ceramic substrate 82 and the power feed member 86, and the power feed member 86 and the coupling member 89 were joined respectively with the joining material 88 at the same time. However, the power feed member 86 and the coupling member 89 may be joined through welding or brazing in advance and, thereafter, the ceramic substrate 82 and the power feed member 86 joined to the coupling member 89 may be joined with the joining material 88. For example, the power feed member 86 formed from Mo and the coupling member 89 formed from Cu was welded in advance by using a AgCu based alloy, so as to produce a Cu/Mo composite power feed member. Subsequently, the bottom and the side surface thereof were subjected to Ni electroplating. Then, the resulting member was joined to the concave portion 84 of the ceramic substrate 82 by using the joining material 88 formed from a AuGe based alloy at 360° C. in a $N_2$ atmosphere. As a result, the joint strength at 200° C. was 11.3 MPa, cracking did not occur, and the characteristics were favorable.

[5] Examples Regarding Specimens S3 to S6

Various studies on Specimens S3 to S6 having different C/R ratios were performed. Specimen S3 (C/R=0.017) was used in Example 46, Specimen S4 (C/R=0.042) was used in Examples 47 and 49, Specimen S5 (C/R=0.083) was used in Example 48, and Specimen S6 (C/R=0.133) was used in Example 50. Furthermore, $Al_2O_3$ was used as the ceramic substrate 72, a AuGe based alloy or a AuSn based alloy was used as the joining material 78, and Mo was used as the power feed member 76. Table 4 shows the joining temperatures and atmospheres in Examples 46 to 50. Moreover, the individual evaluation results are also shown in Table 4. As a result of evaluation of the strength of Examples 46 to 48 and 50, the strength increased gradually as the C/R became small. Furthermore, regarding Example 5, the C/R was 0.008 and, therefore, the C/R was still smaller than those in Examples 46 to 48, so that the strength was further enhanced. Meanwhile, when Example 49 and Example 17, in which a AuSn alloy was used as the joining material 78, were compared, regarding Example 49, the strength of 12.4 MPa was obtained, whereas regarding Example 17, the strength was further enhanced because the C/R was 0.008 and was smaller than that in Example 49. Regarding Examples 46 to 50, D was within the range of −2.2 to −1.0, as described above, and it is believed that a compressive stress, which acted to the ceramic substrate side in the radius direction of the power feed member 76 through the joining layer, was increased and, as a result, the joint strength was increased. In this regard, in these Examples, C/R≤0.15 was satisfied and the 200° C. strength satisfied 3.5 MPa. However, if the value of C/R is large as in Example 50, it is difficult to arrange the power feed member at the center of the hole in the ceramic substrate well in the handling. As a result, strength variations occur easily. Therefore, it is preferable that C/R≤0.09 is satisfied in order to obtain a joining body having higher strength, less variations, and high reliability.

TABLE 4

|  | Ceramic substrate | Power feed member | D (ppm/K) | C/R (—) | Joining material | Joining temperature (° C.) | Atmosphere | 200° C. strength (MPa) | Cracking evaluation | Interfacial peeling |
|---|---|---|---|---|---|---|---|---|---|---|
| Example 46 | $Al_2O_3$ | Mo | −1.3 | 0.017 | AuGe | 360 | $N_2$ | 14.5 | ○ | ○ |
| Example 47 | $Al_2O_3$ | Mo | −1.3 | 0.042 | AuGe | 360 | $N_2$ | 13.4 | ○ | ○ |
| Example 48 | $Al_2O_3$ | Mo | −1.3 | 0.083 | AuGe | 360 | $N_2$ | 10.9 | ○ | ○ |
| Example 49 | $Al_2O_3$ | Mo | −1.3 | 0.042 | AuSn | 310 | $N_2$ | 12.4 | ○ | ○ |
| Example 50 | $Al_2O_3$ | Mo | −1.3 | 0.133 | AuGe | 360 | $N_2$ | 6.2 | ○ | ○ |

The present application claims the benefit of the priority from Japanese Patent Application No. 2011-079462 filed on Mar. 31, 2011, the entire contents of which are incorporated herein by reference.

What is claimed is:

1. A member for a semiconductor manufacturing apparatus, comprising:
    a ceramic substrate having a wafer placement surface;
    an electrode embedded in the inside of the ceramic substrate;
    an exposed electrode portion which is a part of the electrode and which is exposed at the surface opposite to the wafer placement surface of the ceramic substrate;
    a power feed member to supply an electric power to the electrode; and
    a joining layer which is interposed between the ceramic substrate and the power feed member and which joins the power feed member to the ceramic substrate and, at the same time, electrically connects the power feed member to the exposed electrode portion,
    wherein the joining layer is formed by using a AuGe based alloy, a AuSn based alloy, or a AuSi based alloy, which is a joining material,
    the ceramic substrate and the power feed member are selected in such a way that the thermal expansion coefficient difference D calculated by subtracting the thermal expansion coefficient of the ceramic substrate from the thermal expansion coefficient of the power feed member satisfies −2.2≤D≤6 (unit: ppm/K), and
    the joint strength at 200° C. is 3.5 MPa or more.

2. The member for a semiconductor manufacturing apparatus according to claim 1,
    wherein the ceramic substrate and the power feed member are selected in such a way that the thermal expansion coefficient difference D satisfies −1.5≤D≤6 (unit: ppm/K).

3. The member for a semiconductor manufacturing apparatus according to claim 1,
    wherein the joining layer comprises an intermetallic compound phase generated through reaction between a metal contained in a metallized layer covering a predetermined region including the exposed electrode portion before joining and elements other than Au in the joining material.

4. The member for a semiconductor manufacturing apparatus according to claim 3,
    wherein the joining layer comprises a Au-rich phase generated by consumption of the elements other than Au in the joining material through reaction with the metal contained in the metallized layer.

5. The member for a semiconductor manufacturing apparatus according to claim 4,
    wherein the metallized layer, a layer primarily containing the intermetallic compound phase, and a layer primarily containing the Au-rich phase are stacked in the joining layer in that order from the ceramic substrate side.

6. The member for a semiconductor manufacturing apparatus according to claim 3,
    wherein a layer primarily containing the intermetallic compound phase is in contact with the metallized layer or the ceramic substrate in the joining layer.

7. The member for a semiconductor manufacturing apparatus according to claim 4,
    wherein a layer primarily containing the intermetallic compound phase is in contact with the metallized layer or the ceramic substrate in the joining layer.

8. The member for a semiconductor manufacturing apparatus according to claim 5,
    wherein a layer primarily containing the intermetallic compound phase is in contact with the metallized layer or the ceramic substrate in the joining layer.

9. The member for a semiconductor manufacturing apparatus according to claim 1,
    wherein the ceramic substrate comprises one type selected from the group consisting of $Al_2O_3$, AlN, MgO, $Y_2O_3$, and SiC as a primary component, and
    the power feed member is selected from the group consisting of Ti, Cu, Ni, Mo, CuW, W, alloys thereof, and FeNiCo based alloys.

10. The member for a semiconductor manufacturing apparatus according to claim 1,
    wherein the C/R ratio of a clearance C, which is the value calculated by subtracting the diameter of the power feed member from the diameter of a hole in the ceramic substrate, to the diameter R of the hole in the ceramic substrate satisfies C/R≤0.15.

11. The member for a semiconductor manufacturing apparatus according to claim 10,
    wherein the C/R ratio satisfies C/R≤0.09.

12. The member for a semiconductor manufacturing apparatus according to claim 1,
    wherein the surface, which is opposite to the surface joined to the ceramic substrate, of the power feed member is joined to a coupling member, and the thermal expansion coefficient difference D' calculated by subtracting the thermal expansion coefficient of the ceramic substrate from the thermal expansion coefficient of the coupling member is more than 6 ppm/K.

13. The member for a semiconductor manufacturing apparatus according to claim 12,
    wherein the coupling member is a metal formed from Cu or an alloy thereof.

14. The member for a semiconductor manufacturing apparatus according to claim 1, wherein the joining layer comprises an intermetallic compound phase including a metal contained in a metallized layer covering a predetermined region including the exposed electrode portion before joining and elements other than Au in the joining material.

15. The member for a semiconductor manufacturing apparatus according to claim 14, wherein the joining layer comprises a Au-rich phase having a Au concentration of 95 percent by weight or more.

* * * * *